United States Patent [19]
Jost et al.

[11] Patent Number: 5,798,292
[45] Date of Patent: Aug. 25, 1998

[54] METHOD OF FORMING WAFER ALIGNMENT PATTERNS

[75] Inventors: Mark E. Jost; David J. Hansen, both of Boise; Steven M. McDonald, Meridian, all of Id.

[73] Assignee: Micron Technology, Inc., Boise, Id.

[21] Appl. No.: 939,982

[22] Filed: Sep. 29, 1997

Related U.S. Application Data

[62] Division of Ser. No. 691,855, Aug. 2, 1996, Pat. No. 5,700,732.

[51] Int. Cl.$^6$ .................................................. H01L 21/465
[52] U.S. Cl. .................................... 438/401; 438/462
[58] Field of Search ................................ 438/401, 462; 257/797

[56] References Cited

U.S. PATENT DOCUMENTS

| | | | |
|---|---|---|---|
| 4,936,930 | 6/1990 | Gruber et al. | 438/401 |
| 5,128,283 | 7/1992 | Tanaka | 438/401 |
| 5,300,816 | 4/1994 | Lee et al. | 257/797 |
| 5,308,682 | 5/1994 | Morikawa | 438/195 |
| 5,316,966 | 5/1994 | Van Der Plas et al. | 438/401 |
| 5,614,767 | 3/1997 | Ohara | 257/797 |
| 5,618,753 | 4/1997 | Tokushima | 438/666 |
| 5,646,452 | 7/1997 | Narimatsu | 257/797 |

*Primary Examiner*—Charles L. Bowers, Jr.
*Assistant Examiner*—Craig Thompson
*Attorney, Agent, or Firm*—Wells, St. John, Roberts, Gregory & Matkin, P.S.

[57] ABSTRACT

A semiconductor processing method of forming integrated circuitry on a semiconductor wafer includes, a) forming at least two discrete wafer alignment patterns on the wafer, the two discrete alignment patterns having respective-series of elevation steps provided therein; and b) while fabricating integrated circuitry elsewhere on the wafer, processing a first portion of at least one of the alignment patterns differently from a second portion of the one alignment pattern to render the first portion to be different from the second portion in the one alignment pattern. Such preferably superimposes a secondary step, most preferably of the same degree, over only a portion of the elevation steps in at least one of the wafer alignment patterns. Further, a semiconductor processing method of forming integrated circuitry on a semiconductor wafer includes, i) forming at least two discrete wafer alignment patterns on the wafer, the two discrete alignment patterns having respective series of elevation steps provided therein; and ii) while fabricating integrated circuitry elsewhere on the wafer, processing one of the alignment patterns differently from the other to render the one alignment pattern to be different from the other alignment pattern.

27 Claims, 7 Drawing Sheets

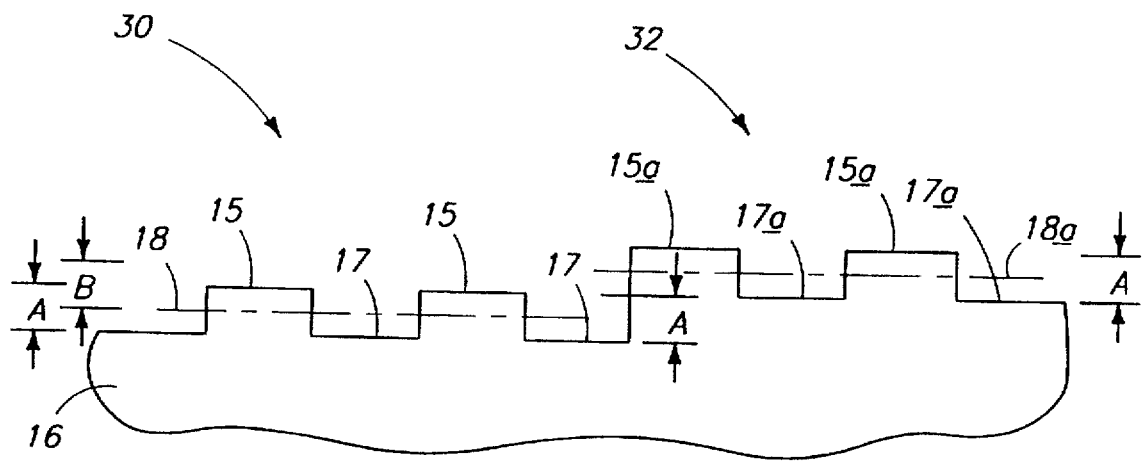
F I G 4
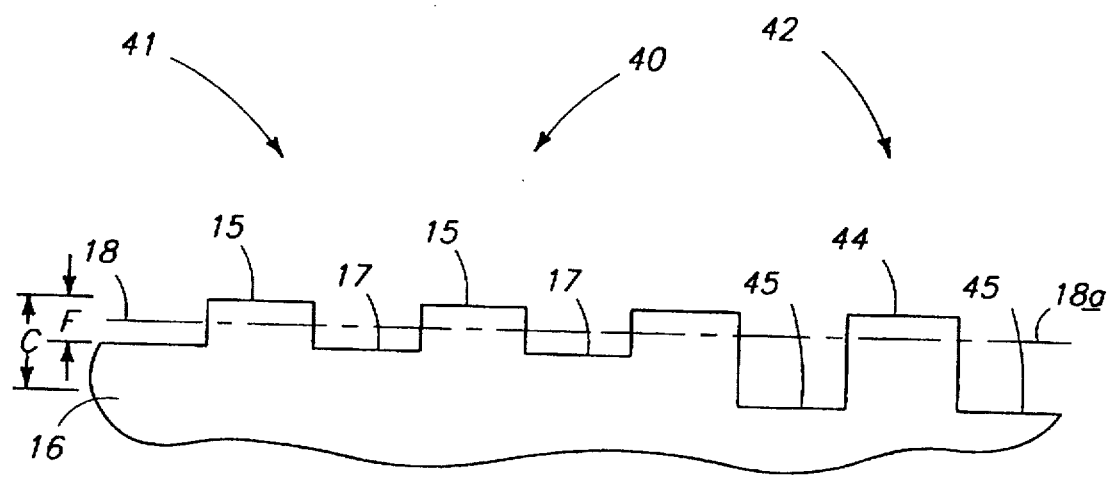
F I G 5

METHOD OF FORMING WAFER ALIGNMENT PATTERNS

RELATED PATENT DATA

This patent resulted from a divisional application of U.S. patent application Ser. No. 08/691,855, filed Aug. 2, 1996, now U.S. Pat. No. 5,700,732 titled "Semiconductor Wafer, Wafer Alignment Patterns And Method Of Forming Wafer Alignment Patterns", and listing Mark E. Jost, David J. Hansen, and Steven M. McDonald as the inventors.

TECHNICAL FIELD

This invention relates generally to semiconductor wafer and photomask alignment, and to fabrication of semiconductor wafers having alignment patterns which facilitate the same.

BACKGROUND OF THE INVENTION

Photo patterning of semiconductive wafers requires precise positioning of a reticle or mask relative to the semiconductive wafer being processed. To achieve such precise positioning, the exact orientation or location of the wafer must be known such that the mask can be precisely placed. This is typically accomplished by moving the wafer beneath fixed optics which determine the wafer's precise location relative to a table on which the wafer rests and moves relative to the optics. The optics are directed toward the wafer to determine location of predetermined patterns provided in the wafer at at least two discrete locations, such that wafer orientation is determined. With such known, the photomask and wafer can be precisely positioned in a desired relative orientation for processing.

The wafer alignment patterns typically include discrete areas on the semiconductor substrate which are initially patterned to form multiple series of precisely configured parallel lines. In subsequent processing of the wafer, sometimes these wafer alignment patterns are masked such that they are not subjected to the specific processing, while other times they are left unmasked and are accordingly processed. For example, in some instances it is desirable to provide a planarized layer of a highly reflective or opaque material. Such a layer, because it is planarized, would not repeat the underlying pattern and substantially all incident light would be reflected away or absorbed. In such instance, the underlying alignment pattern would be lost. Accordingly in such instances, the wafer alignment pattern area would not be masked such that etching of such materials would not occur over the alignment patterns.

Where planarization does not occur or where a planarized layer is suitably light transmissive to reveal the underlying pattern, the wafer alignment areas are typically masked during processing. Not masking of the wafer alignment pattern area throughout processing is typically not desired, as such would adversely effect overall global planarity of the wafer and eventually result in the wafer alignment patterns being received in deep holes or caverns. This would adversely effect the utility of the patterns and lead to other wafer processing problems. For example, whether an alignment step is masked or not masked during a photoexposure depends on several factors. These include, 1.) the ability to see the alignment step at the next photo step; 2) the impact on the rest of the wafer, such as cracking and planarity; and 3) consistency in being able to get good alignment at all subsequent photosteps.

The increasing circuit density and vertical integration associated therewith has lead to increasing utilization of planarizing steps to assure an overall planar wafer which is easier to process. This, however, has placed difficult constraints upon photomask alignment relative to the wafers being processed. Specifically, contrasts provided by illuminating the wafer with incident light must rely in part upon differences in light intensity resulting from internal reflections off of a buried structure. This presents only minor problems for a single layer of surface planarized material, or for a stack of surface planarized transparent materials where each has a similar index of refraction and the underlying film has high reflectance. However where a stack of two planarized layers of different material having substantially different indexes of refraction is utilized, obtaining adequate contrast for ultimate wafer and photomask alignment becomes considerably more complex. An example is described below where a planar layer of polysilicon is provided over a surface planarized layer of oxide, with both such layers being provided over a silicon or silicide step in a wafer pattern alignment area.

The discussion initially proceeds with reference to FIGS. 1 and 2 illustrating a typical prior art wafer alignment pattern. FIGS. 1 and 2 illustrate a wafer alignment pattern indicated generally with reference numeral 10 patterned relative to a bulk monocrystalline silicon wafer 16. At least two of such patterns would be discretely located relative to the outer silicon wafer surface. Preferably, four of such discretely spaced patterns 10 are utilized. Wafer alignment pattern 10 is comprised of four discrete, or sub-discrete, alignment patterns 11, 12, 13 and 14. Wafer alignment pattern 10 is square, with each of sub-alignment patterns 11, 12, 13 and 14 also being square and located in one of the four quadrants of pattern 10. A central plus (+) 9 is centrally provided.

Each pattern 11, 12, 13 and 14 comprises a plurality of patterned elevation steps/valleys/lines 15 initially provided in the outer surface of silicon substrate 16. Accordingly, lands or valleys 17 (FIG. 2) are provided between elevation steps 15. The wafer alignment patterns utilize substantially a same, common elevation step change "A" between lands 17 and 15 throughout all wafer alignment patterns on the wafer, with an example being 1000 Angstroms. Further, all of the elevation steps are provided at a substantially common average elevation relative to the wafer. Such is indicated in FIG. 2 with numeral 18 as the elevation within wafer 16 between lands 17 and outer portion of elevation steps 15.

FIG. 2 illustrates example subsequent layers deposited over wafer alignment pattern 10. Such include, for example, a conformal film 20, a planarized oxide layer 21, and an overlying planarized polysilicon layer 22. Both are suitably light transmissive to enable underlying topography to be perceived by laser light. Yet, the polysilicon of layer 22 has a substantially different refractive index from that of the oxide of layer 21. Depending upon the relative thicknesses of layers 21 and 22, this can create significant problems in achieving adequate contrast to determine underlying wafer pattern structure from steps 15 and lands 17. This results primarily from an undesired large quantity of light being reflected off the interface between planarized layers 21 and 22, as well as off the top of layer 22.

Inherent thicknesses of such layers can also be a significant factor in achieving adequate contrast. For example in some instances, there are thicknesses of polysilicon layer 22 where poor contrast is obtained for a given elevation step height between lands 17 and step 15 for any thickness of planar oxide layer 21. Selecting a better polysilicon thickness greatly improves the situation, but there still exists oxide thicknesses where very poor contrast is obtained.

Such is graphically apparent from FIG. 3. Such illustrates lines of constant reflectivity data as a function of thickness of a planarized polysilicon layer overlying a planarized oxide layer. Such data is relative to an underlying wafer alignment pattern having a 900 Angstrom elevation step change between lands 17 and peaks 15 and utilizing a 633 nanometer He-Ne laser imaging system. Areas where low or unacceptable contrast is obtained for determining wafer pattern location is depicted in the hatch-shaded areas of the graph. On the other hand, high or acceptable contrast is generally obtained in those illustrated areas where the illustrated lines of constant reflectivity form self-enclosed rings or ovals.

For example, areas 24 and 25 run substantially continuously across or over the illustrated graph, and constitute planarized oxide and planarized silicon combinations where unacceptably low contrast would be obtained. Other areas, such as 26, 27 and 28, are discretely independently enclosed and evidence areas where good contrast is obtained for determining the underlying wafer alignment pattern.

As is apparent with this described example, planarized polysilicon thickness of, for example, 700 Angstroms and 1425 Angstroms result in poor contrast areas on the graph independent of oxide thickness. Accordingly in this example, the wafer processor would fundamentally avoid using planarized polysilicon layers of these thicknesses. The processor would rather attempt to operate in some other area of the depicted graph where adequate contrast is more likely. For example, for a polysilicon thickness of 1100 Angstroms, good example contrast is obtained for oxide thicknesses of between about 8625 Angstroms to about 9525 Angstroms. Yet, poor contrast would be obtained for such a polysilicon layer for oxide thicknesses of about 8500 Angstroms or about 8600 Angstroms.

A challenge facing the processor, however, is that the thickness of outer planarized polysilicon layer 22 is rather easy to control, whereas some underlying planarized layers such as oxide layer 21 are comparatively difficult to control. The processor can thereby avoid thicknesses of the outer layer which are inherently bad for any oxide thickness, but is left hoping that the less controllable underlying planarized layer doesn't result in falling into an area of comparative thickness where contrast is less than adequate. Such would result in loss of an ability to determine location or existence of underlying wafer alignment pattern structure.

For example with the FIGS. 1 and 2 embodiment, oxide thickness needs to be controlled to better than 500 Angstroms to avoid a resultant inadequate contrast situation for the depicted prior art wafer alignment pattern structure. This is better control than can typically be expected, relying upon typical planarizing techniques.

Accordingly, it would be desirable to overcome or alleviate the above described problems to achieve improved contrast relative to wafer alignment patterns which is less dependent upon variable thickness of an underlying planarized layer.

BRIEF DESCRIPTION OF THE DRAWINGS

Preferred embodiments of the invention are described below with reference to the following accompanying drawings.

FIG. 4 is a diagrammatic cross sectional view of a semiconductor wafer fragment processed in accordance with the invention.

FIG. 5 is a diagrammatic cross sectional view of an alternate semiconductor wafer fragment processed in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
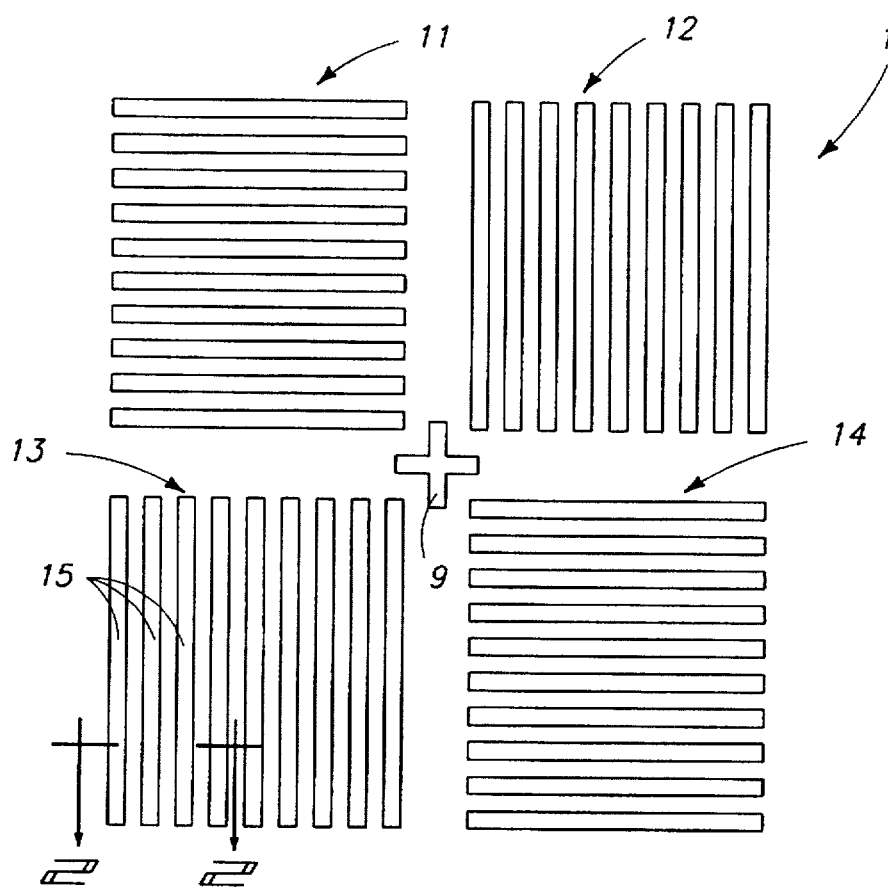
FIG. 1 is a top diagrammatic view of a prior art wafer alignment pattern, and is discussed in the "Background" section above.
Figure 2:
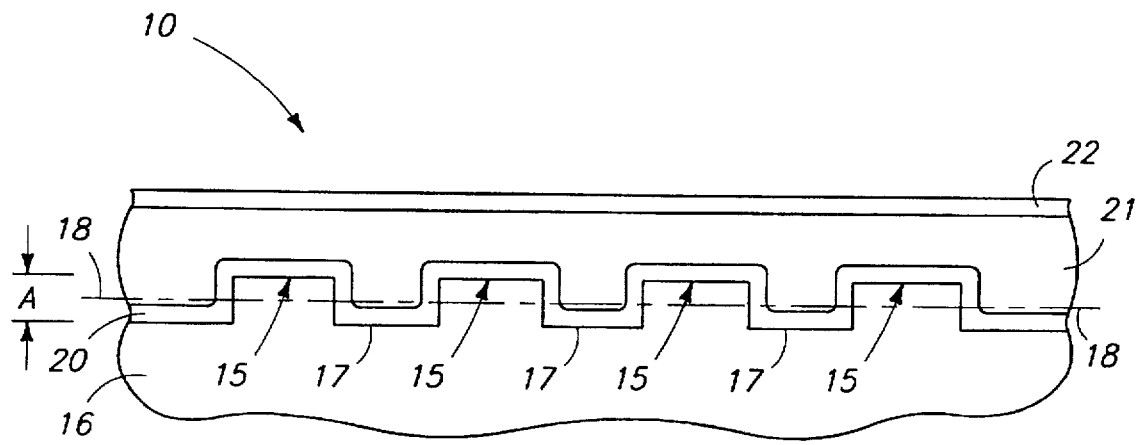
FIG. 2 is a cross sectional view taken through line 2—2 in FIG. 1.

Several preferred embodiments are described. The preferred processing initially proceeds with fabrication of at least two discrete wafer alignment patterns on a semiconductor wafer, such as depicted in FIGS. 1 and 2. Wafer alignment pattern 10 can be considered as one discrete wafer alignment pattern, or alternately each of wafer alignment patterns 11, 12, 13 and 14 can be considered as discrete wafer alignment patterns. Regardless, each alignment pattern has a respective series of elevation steps 15 provided therein. All elevation steps 15 in individual alignment patterns as initially provided in FIGS. 1 and 2 have substantially the same elevation step change "A", and are provided at a substantially common average elevation 18 relative to substrate 16.

FIG. 4 diagrammatically illustrates example preferred processing result s in accordance with preferred aspects of the invention. FIG. 4 illustrates one example portion 30 and another example portion 32 of at least one alignment pattern 11, 12, 13 or 14. Portion 32 is processed differently from portion 30 to render portion 32 to be different from portion 30 in the illustrated and depicted FIG. 4 alignment pattern. Such processing preferably occurs substantially simultaneously with processing or fabricating of integrated circuitry elsewhere on the wafer, such that dedicated processing of the wafer alignment area is not separately conducted. The preferred processing results in the FIG. 4 illustrated superimposing of a secondary step 15a, with associated lands 17a, over only a portion (i.e. portion 32) of the elevation steps in at least one wafer alignment pattern. In the preferred embodiment, the secondary steps have the same elevation degree change "A" as the elevation steps in the non-superimposed portion.

An intent in accordance with the above described preferred embodiment is to provide additional elevation steps in only a portion of at least one alignment pattern. Such can be accomplished by masking only one or a first portion of at least one alignment pattern (i.e. portion 30) while subjecting another or second portion (i.e. portion 32) of the at least alignment pattern to processing conditions effective to change the portion being processed. In the FIG. 4 depicted and preferred embodiment, the relative average elevation 18a of elevation steps 15a in portion 32 has been changed from average elevation 18 of elevation steps 15 in portion 30 (i.e. outside of portion 32) at least in the illustrated one alignment pattern. The processing in portion 32 relative to portion 30 can comprise any of oxide growth, material deposition, etching, or other processing to produce a desired change from one portion to the other portion.

A preferred goal is to provide a change or delta "B" in the step height of at least a portion of a wafer alignment pattern. Such facilitates achieving adequate contrast in the following manner. Where for example the initially provided wafer alignment patterns have a silicon dioxide and polysilicon layer thickness combination resulting in landing in a poor contrast area of the FIG. 3 graph, the delta height step "B" will effectively move the contrast situation from outwardly of s the poor contrast area hopefully into a good contrast area.

Figure 3:
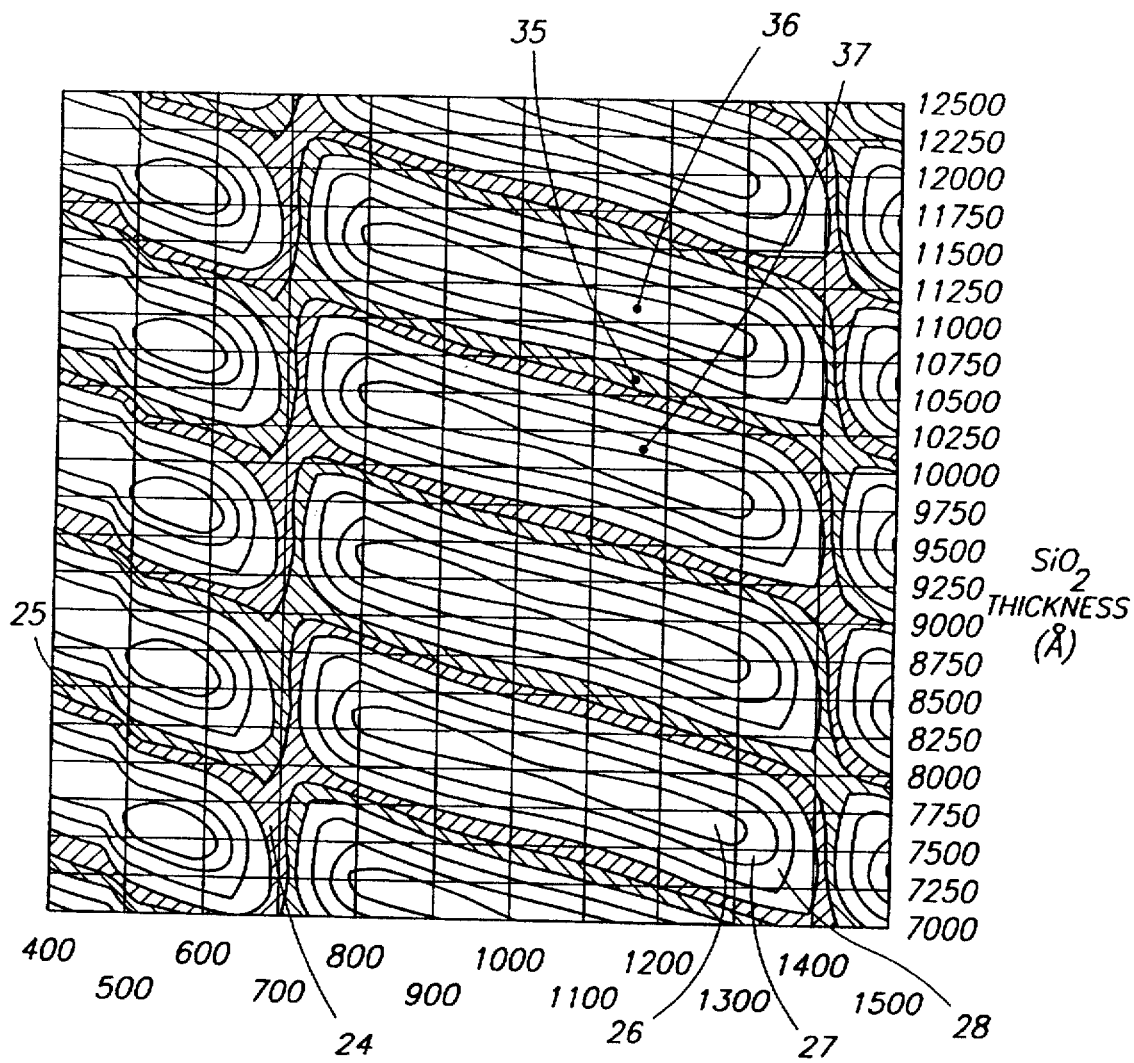
FIG. 3 is a graphical representation of contrast regions using laser illumination for a combination of different thickness planarized polysilicon and silicon dioxide layers, where the polysilicon overlies the silicon dioxide.

For example with respect to FIG. 3, consider initial combination thicknesses of planarized polysilicon and oxide layers falling at location 35 on the graph. A step height delta "B" of approximately 500 Angstroms will move the contrast situation for portion 32 (FIG. 4) from poor contrast location 35 to a good or acceptable contrast area 36 as shown in FIG. 3. Accordingly, the delta "B" step difference where such is utilized is preferably not selected to be equal to the oxide thickness difference vertically along the graph between two unacceptable regions. This would have a tendency to merely jump from one poor contrast area to another. Acceptable and unacceptable contrast relationships are previously known or can be determined. Accordingly, as the step difference from 18 to 18a can be precisely controlled, a wafer processor or designer can easily tailor the initial alignment pattern processing such that the step height "B" will not result in this undesired step change difference.

Note however in the preferred embodiment that only a portion of the illustrated wafer alignment pattern has this patterned delta step change "B" feature. This is pertinent in the possible event the wafer was processed such that the delta "B" chosen adversely moves the processed wafer from an area of acceptable contrast relative to FIG. 3 (i.e., location 37) into an unacceptable area of contrast (i.e., location 35). Such is not particularly adverse in accordance with preferred aspects of the invention, as only a portion of at least one wafer misalignment pattern has been patterned with such delta. In otherwords, the initially patterned portion of the wafer misalignment pattern that has not been subsequently processed to provide the delta "B" in such instance is already provided within an acceptable contrast region for the optics. Accordingly, that portion of the wafer alignment pattern which has not been processed to produced the delta "B" elevation step change will be determinable by the optics (typically laser illumination) such that the position of the subject wafer alignment pattern can be located or determined. The above preferred processing does however overcome or substantially reduce the above described prior art problem where the initial wafer alignment patterning and subsequent provision of planarized layers results in falling within an unacceptable contrast area for pattern determination for the whole alignment pattern.

Preferably, the step change "B" (effectively the difference between average elevation 18 and average elevation 18a) is chosen to be not equal to "n X lambda/4N", where "n" is an integer, lambda is the wave length of intended incident light in vacuum to be utilized in the optics to locate the depicted one alignment pattern, and N is the index of refraction of the surface planarized layer whose lower surface contacts the top surface of the embedded alignment structure (i.e., the planarized layer elevationally closest to the one alignment pattern). If initially very poor contrast exists, choosing "B" to be equal to "n X lambda/4N" can merely result in moving from one low contrast situation to another. A most preferred step change "B" is "lambda/8N".

An alternate preferred embodiment wafer alignment pattern is diagrammatically represented in FIG. 5. Such depicts processing as would preferably occur subsequent to the initial patterning to produce elevation steps 15 and lands 17 of the FIG. 2 embodiment, and prior to any subsequent processing or depositions thereover. FIG. 5 illustrates a wafer fragment having a wafer alignment pattern 40 with portions 41 and 42. Elevation steps 15 and lands 17 are initially provided as in the FIG. 2 embodiment, and are shown after subsequent processing relative to portion 42. Elevation steps 15 have an elevation step degree between peaks 15 and lands 17 depicted by "F". Portion 42 of wafer alignment pattern 40 is processed to change or provide a different elevation step degree "C" to new elevation steps 44 and lands 45.

Such alternate preferred processing will also facilitate achieving adequate contrast in accordance with the above described first embodiment. Most preferably, the difference between "C" and "F" is chosen to not correspond with the planarized layer thickness differences which would move from one low contrast area to another low contrast area.

Figure 6:
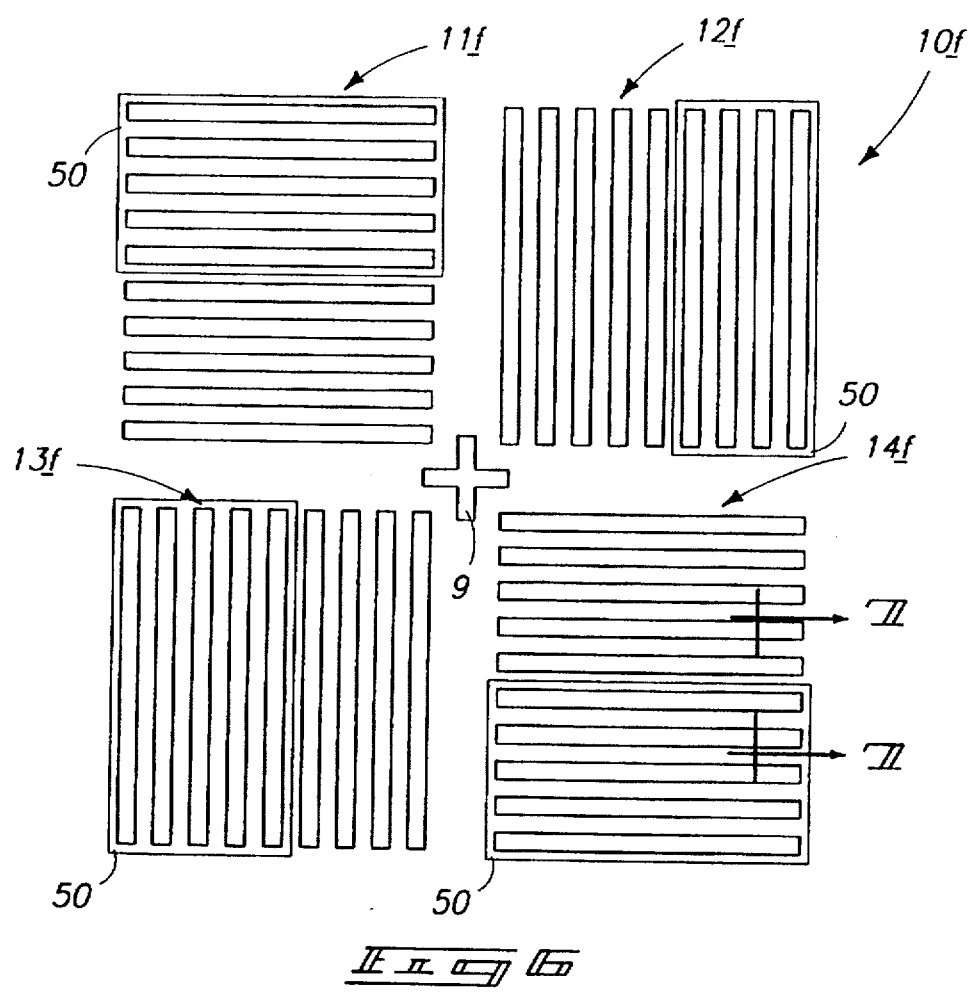
FIG. 6 is a top diagrammatic view of a wafer alignment pattern in accordance with the invention.
Figure 7:
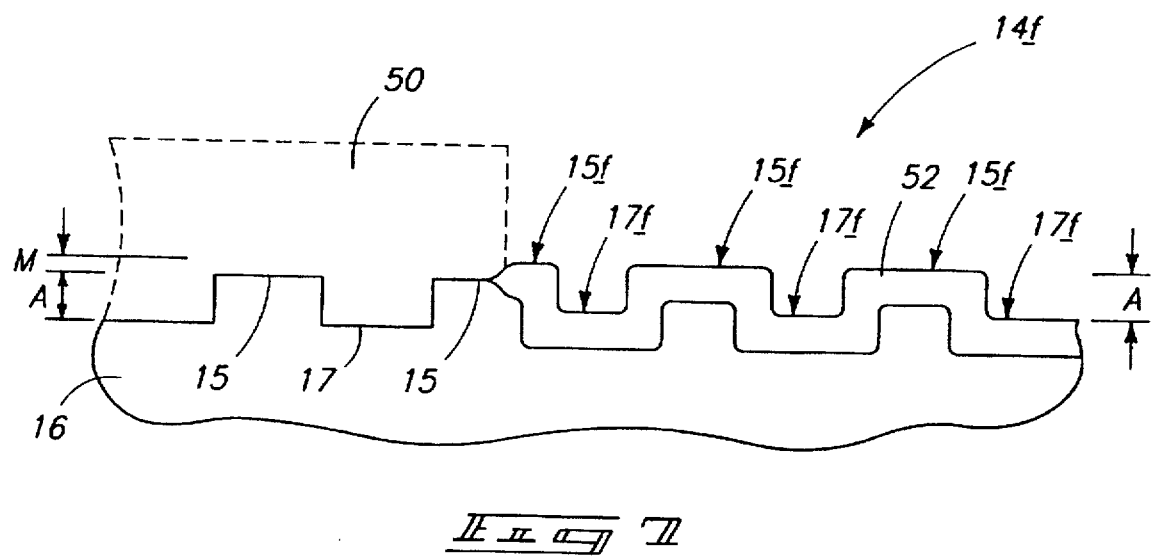
FIG. 7 is a cross sectional view taken through line 7—7 in FIG. 6.

Example processing to achieve desired step change diagrammatically depicted in FIG. 4 is now described with reference to FIGS. 6 and 7. Such depicts the familiar example general wafer alignment pattern now depicted as numeral 10f, and modified discrete (or sub-discrete) alignment patterns 11f, 12f, 13f and 14f. Processing is conducted preferably in accordance with field oxide formation in a manner which facilitates change in a portion of the discrete patterns without a separate or dedicated processing or masking steps.

Specifically, the prior art would typically, during field oxidation LOCOS, mask the entirety of the wafer alignment pattern area such that no field oxide forms therein. In accordance with this preferred aspect of the invention, a portion of a least one discrete wafer alignment pattern is partially masked such that field oxide forms in only a portion of at least one wafer alignment pattern. Specifically, numeral 50 (FIGS. 6 and 7) depicts a conventional nitride LOCOS mask deposited and patterned to cover only a portion of the depicted discrete wafer alignment pattern 14f. The wafer is then subjected to LOCOS conditions to form desired field oxide on unpatterned areas elsewhere on the wafer, and also to form the illustrated oxide region 52 essentially continuously over the remaining exposed portion of pattern 14f. Such effectively results in a delta or elevation step height change "M" to produce elevation steps 15f and associated upwardly moved lands 17f.

Such provides but one example method of how existing processing methods can be utilized in association with only a portion of at least one discrete wafer alignment pattern in accordance with the invention. Alternate techniques, would of course include etching or other deposition or provision of material over only a portion of at least one wafer alignment pattern. In the depicted and preferred embodiments, at least a portion of each wafer alignment pattern 11f, 12f, 13f and 14f is altered in accordance with the invention.

Figure 8:
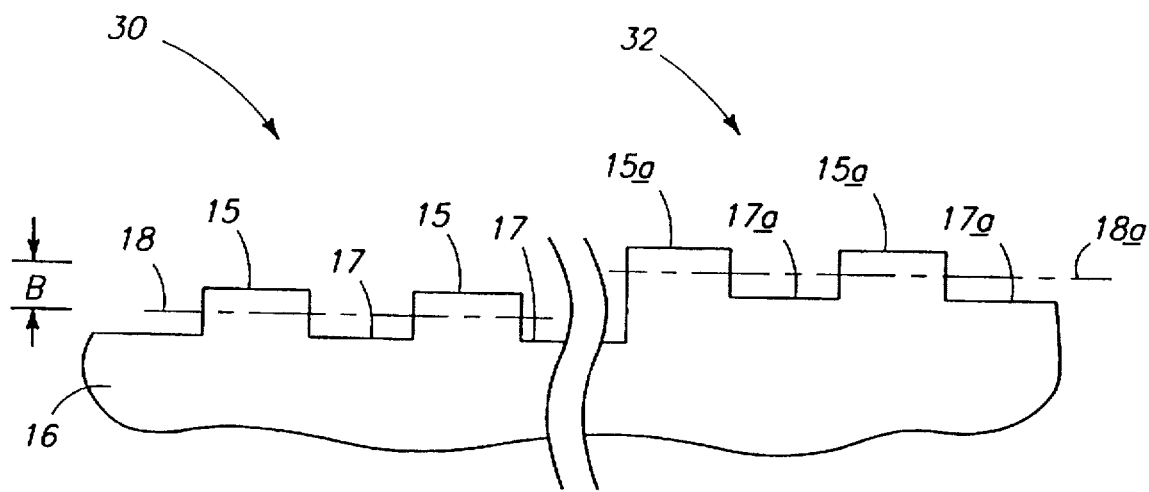
FIG. 8 is a diagrammatic cross sectional view of another alternate semiconductor wafer fragment processed in accordance with the invention.

The above described preferred embodiment contends with fabricating only a portion of at least one wafer alignment pattern differently from another portion of the same alignment pattern. Also in accordance with the invention, the entirety of one alignment pattern can be processed differently from the entirety or a portion of another separate discrete alignment pattern. For example, such is depicted with reference to FIGS. 8 and 9. FIG. 8 is essentially the same as the FIG. 4 depiction, with the same numerals being utilized, but illustrates a break between the depicted left and right portions, intending to indicate two separate or discrete alignment patterns which would be processed differently in their entirety. Such provides, for example, the desired increased delta "B" from one alignment pattern to another alignment pattern. Such thereby effectively insures that at least one of the alignment patterns will be located in an acceptable or good contrast area when the other alignment pattern might not be so located.

A plurality of greater than two such alignment patterns can be provided on the wafer with different respective patternings. Accordingly, the fabricator can design the plurality of wafer patterns with desired different steps at different desired elevations relative to the wafer in such a manner that at least two of such plurality can be determined substantially independent of planarized layer thickness.

Figure 9:
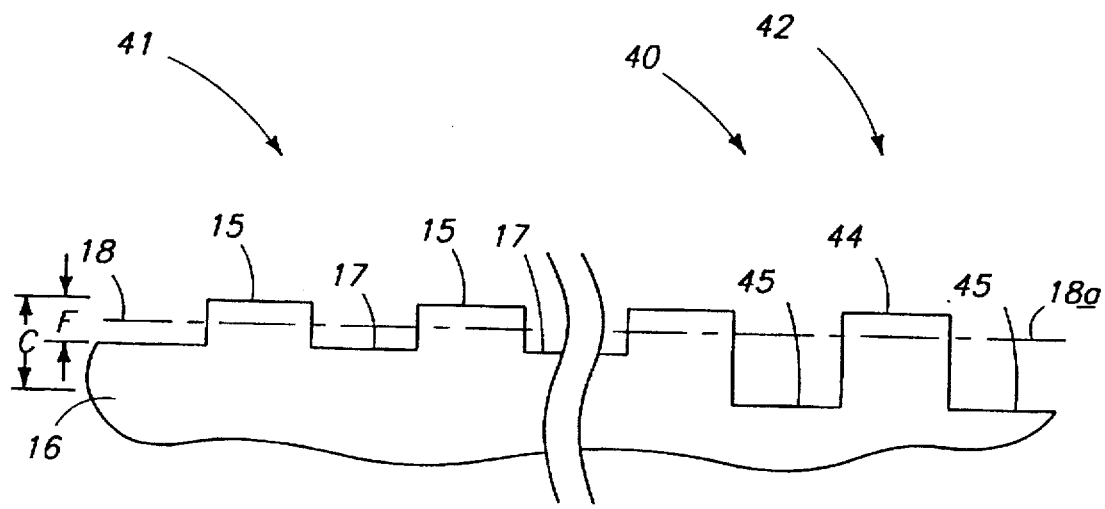
FIG. 9 is a diagrammatic cross sectional view of still another alternate semiconductor wafer fragment processed in accordance with the invention.

FIG. 9 is similar to the FIG. 5 depiction, but illustrates example discrete wafer alignment patterns patterned differently by deeper etching in one as compared to another.

Figure 10:
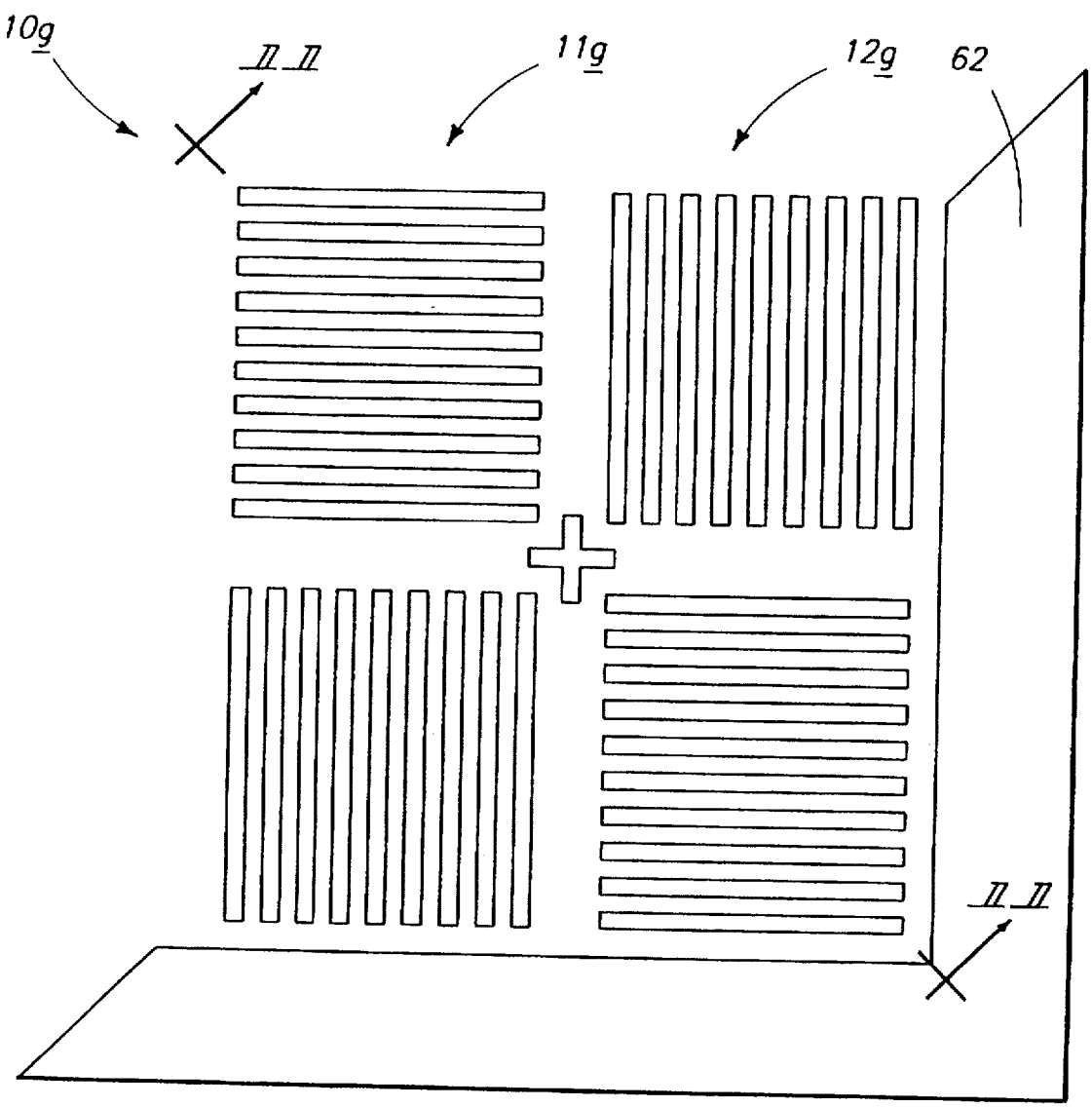
FIG. 10 is a top diagrammatic view of a an alternate wafer patterned in accordance with the invention.
Figure 11:
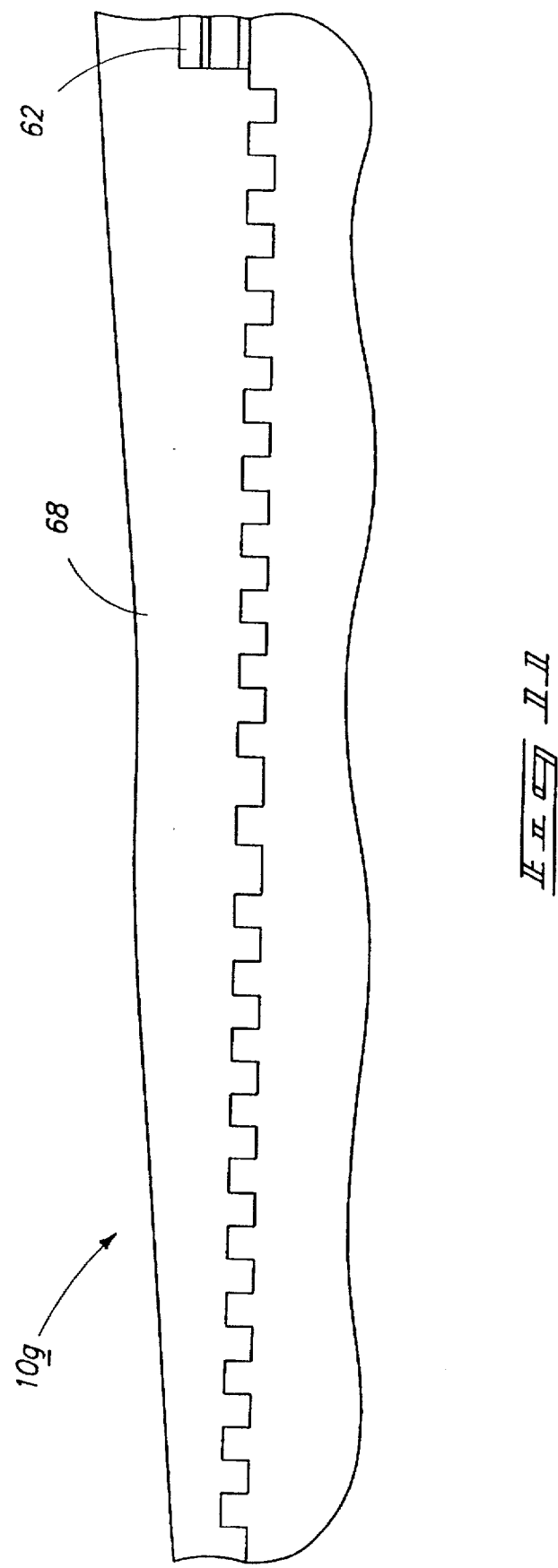
FIG. 11 is reduced scale a cross sectional view taken through line 11—11 in FIG. 10.

Further alternate processing is described with reference to FIGS. 10 and 11. Like numerals are utilized from the previous embodiments, with differences being indicated with the suffix "g" or with different numerals. Here, an elevation step preferably in the form of a gate stack 62 is provided externally of only one portion of the one alignment pattern 10g. That portion in the illustrated embodiment is along or relative to the bottom and right portions of pattern 10g. Preferably, gate stack step 62 is provided in simultaneous conjunction with fabrication of gate lines elsewhere on the wafer.

The positioning of such an elevation step in proximity to only a portion of the periphery of pattern 10g will influence subsequent polishing across the pattern. Specifically, FIG. 11 illustrates a planarized insulating dielectric layer 68 provided over step 62 and pattern 10g. During the polishing to produce the illustrated layer 68, such as by chemical-mechanical polishing, more material 68 will be removed over that portion of the alignment pattern furthest from elevation step 62 than that portion closest to elevation step 62. Thus a thicker amount of the illustrated covering material 68 will remain over one portion (the lower right portion of FIG. 10) than over another opposing portion (the upper left portion of FIG; 10) of the same alignment pattern. Thus in this described example, the processing of one portion different from another portion of one alignment pattern comprises polishing the one and another portions to different degrees.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming wafer alignment patterns on a semiconductor wafer comprising:

forming at least two discrete wafer alignment patterns on the wafer, the two discrete alignment patterns having respective series of elevation steps provided therein; and superimposing a secondary step over only a portion of the elevation steps in at least one of the wafer alignment patterns.

2. The semiconductor processing method of forming wafer alignment patterns of claim 1 wherein the superimposing comprises deposition of a material in the portion to change average elevation of the elevation steps relative to the wafer in the portion compared to average elevation of the elevation steps outside the portion in the one alignment pattern.

3. The semiconductor processing method of forming wafer alignment patterns of claim 1 wherein the superimposing comprises growing oxide in the portion to raise average elevation of the elevation steps relative to the wafer in the portion compared to average elevation of the elevation steps outside the portion in the one alignment pattern.

4. The semiconductor processing method of forming wafer alignment patterns of claim 1 wherein all elevation steps in the one alignment pattern as initially provided are of substantially the same elevation step change and at a substantially common average elevation relative to the wafer.

5. The semiconductor processing method of forming wafer alignment patterns of claim 1 wherein the processing is conducted in only a portion of both said wafer alignment patterns.

6. The semiconductor processing method of forming wafer alignment patterns of claim 1 wherein, the respective series of elevation steps are provided at respective average elevations relative to the wafer, the secondary step defining a step change between the elevation steps in the portion and the elevation steps outside the portion in the one alignment pattern, the step change comprising a change in the relative average elevation of the elevation steps in the portion from the average elevation of the elevation steps outside the portion in the one alignment pattern;

and further comprising providing at least two substantially planarized layers over the one alignment pattern, the two planarized layers having different indexes of refraction; and the step change in the relative average elevation being not equal to "n X lambda/4N", where "n" is an integer, lambda is the wave length of intended incident light in vacuum to be utilized in the optics to locate the depicted one alignment pattern, and N is the index of refraction of one of the two planarized layers which is elevationally closest to the one alignment pattern.

7. A semiconductor processing method of forming wafer alignment patterns on a semiconductor wafer comprising:

forming at least two discrete wafer alignment patterns on the wafer, the two discrete alignment patterns having respective series of elevation steps provided therein; and providing additional elevation steps in only a portion of at least one alignment pattern.

8. The semiconductor processing method of forming wafer alignment patterns of claim 7 wherein the additional elevation steps are provided by deposition of a material in the portion to change average elevation of the elevation steps relative to the wafer in the portion compared to average elevation of the elevation steps outside the portion in the one alignment pattern.

9. The semiconductor processing method of forming wafer alignment patterns of claim 7 wherein the additional elevation steps are provided by growing oxide in the portion to raise average elevation of the elevation steps relative to the wafer in the portion compared to average elevation of the elevation steps outside the portion in the one alignment pattern.

10. The semiconductor processing method of forming wafer alignment patterns of claim 7 wherein all elevation steps in the one alignment pattern as initially provided are of substantially the same elevation step change and at a substantially common average elevation relative to the wafer.

11. The semiconductor processing method of forming wafer alignment patterns of claim 7 wherein the processing is conducted in only a portion of both said wafer alignment patterns.

12. The semiconductor processing method of forming wafer alignment patterns of claim 7 wherein, the respective series of elevation steps are provided at respective average elevations relative to the wafer, the additional elevation steps defining a step change between the elevation steps in the portion and the elevation steps outside the portion in the one alignment pattern, the step change comprising a change in the relative average elevation of the elevation steps in the portion from the average elevation of the elevation steps outside the portion in the one alignment pattern;

and further comprising providing at least two substantially planarized layers over the one alignment pattern, the two planarized layers having different indexes of refraction; and the step change in the relative average elevation being not equal to "n X lambda/4N", where "n" is an integer, lambda is the wave length of intended incident light in vacuum to be utilized in the optics to locate the depicted one alignment pattern, and N is the index of refraction of one of the two planarized layers which is elevationally closest to the one alignment pattern.

13. A semiconductor processing method of forming wafer alignment patterns on a semiconductor wafer comprising:

forming at least two discrete wafer alignment patterns on the wafer, the two discrete alignment patterns having respective series of elevation steps provided therein; and masking a first portion of at least one of the alignment patterns while subjecting a second portion of the at least one alignment pattern to processing conditions effective to change the second portion from the first portion.

14. The semiconductor processing method of forming wafer alignment patterns of claim 13 wherein the processing comprises growing oxide in the second portion to raise average elevation of the elevation steps relative to the wafer in the second portion compared to average elevation of the elevation steps in the first portion.

15. The semiconductor processing method of forming wafer alignment patterns of claim 13 wherein the processing comprises etching in the second portion to change average elevation of the elevation steps relative to the wafer in the second portion compared to average elevation of the elevation steps in the first portion.

16. The semiconductor processing method of forming wafer alignment patterns of claim 13 wherein the processing comprises deposition of a material in the second portion to change average elevation of the elevation steps relative to the wafer in the second portion compared to average elevation of the elevation steps in the first portion.

17. The semiconductor processing method of forming wafer alignment patterns of claim 13 wherein all elevation steps in the one alignment pattern as initially provided are of substantially the same elevation step change and at a substantially common average elevation relative to the wafer.

18. The semiconductor processing method of forming wafer alignment patterns of claim 13 wherein the processing is conducted in a portion of both said wafer alignment patterns.

19. The semiconductor processing method of forming wafer alignment patterns of claim 13 wherein, the respective series of elevation steps are provided at respective average elevations relative to the wafer, the difference between the first and second portion comprising a change in the relative average elevation of the elevation steps in the second portion from the average elevation of the elevation steps in the first portion in the one alignment pattern;

and further comprising providing at least two substantially planarized layers over the one alignment pattern, the two planarized layers having different indexes of refraction; and the step change in the relative average elevation being not equal to "n X lambda/4N", where "n" is an integer, lambda is the wave length of intended incident light in vacuum to be utilized in the optics to locate the depicted one alignment pattern, and N is the index of refraction of one of the two planarized layers which is elevationally closest to the one alignment pattern.

20. A semiconductor processing method of forming wafer alignment patterns on a semiconductor wafer comprising:

forming at least two discrete wafer alignment patterns on the wafer, the two discrete alignment patterns having respective series of elevation steps provided therein at respective average elevations relative to the wafer; and processing only a portion of at least one of the alignment patterns to change at least one of, a) elevation step degree of the elevation steps in the portion compared to elevation step degree of the elevation steps outside the portion in the one alignment pattern, or b) the relative average elevation of the elevation steps in the portion from the average elevation of elevation steps outside of the portion in the one alignment pattern.

21. The semiconductor processing method of forming wafer alignment patterns of claim 20 wherein the processing is conducted in only a portion of both said wafer alignment patterns.

22. The semiconductor processing method of forming wafer alignment patterns of claim 20 wherein, the respective series of elevation steps are provided at respective average elevations relative to the wafer, the change comprising a step change between the elevation steps in the portion and the elevation steps outside the portion in the one alignment pattern, the step change comprising a change in the relative average elevation of the elevation steps in the portion from the average elevation of the elevation steps outside the portion in the one alignment pattern;

and further comprising providing at least two substantially planarized layers over the one alignment pattern, the two planarized layers having different indexes of refraction; and the step change in the relative average elevation being not equal to "n X lambda/4N", where "n" is an integer, lambda is the wave length of intended incident light in vacuum to be utilized in the optics to locate the depicted one alignment pattern, and N is the index of refraction of one of the two planarized layers which is elevationally closest to the one alignment pattern.

23. A semiconductor processing method of forming wafer alignment patterns on a semiconductor wafer comprising forming at least two discrete wafer alignment patterns on the wafer, the two discrete alignment patterns having respective series of elevation steps provided therein, the elevation steps in one pattern being different in degree from the elevation steps in the other pattern.

24. The semiconductor processing method of forming wafer alignment patterns of claim 23 wherein, the respective series of elevation steps are provided at respective average elevations relative to the wafer, the degree difference comprising a step change between the elevation steps in the one pattern and the elevation steps in the other pattern, the step change comprising a change in the relative average elevation of the elevation steps in the one pattern from the average elevation of the elevation steps in the other pattern;

and further comprising providing at least two substantially planarized layers over the one alignment pattern, the two planarized layers having different indexes of refraction; and the step change in the relative average elevation being not equal to "n X lambda/4N", where "n" is an integer, lambda is the wave length of intended incident light in vacuum to be utilized in the optics to locate the depicted one alignment pattern, and N is the index of refraction of one of the two planarized layers which is elevationally closest to the one alignment pattern.

25. A semiconductor processing method of forming wafer alignment patterns on a semiconductor wafer comprising forming at least two discrete wafer alignment patterns on the wafer, the two discrete alignment patterns having respective series of elevation steps provided therein at respective average elevations relative to the wafer, the elevation steps in one pattern being provided at a different average elevation relative to the wafer from the average elevation relative to the wafer that the other pattern of elevation steps is provided.

26. The semiconductor processing method of forming wafer alignment patterns of claim 25, and further comprising providing at least two substantially planarized layers over the alignment patterns, the two planarized layers having different indexes of refraction; and the difference in average elevation between the one pattern and the other pattern being not equal to "n X lambda/4N", where "n" is an integer, lambda is the wave length of intended incident light in vacuum to be utilized in the optics to locate the depicted one alignment pattern, and N is the index of refraction of the planarized layer which is elevationally closest to the one alignment pattern.

27. A semiconductor processing method of forming wafer alignment patterns on a semiconductor wafer comprising:

forming at least two discrete wafer alignment patterns on the wafer, the two discrete alignment patterns having respective series of elevation steps provided therein; and masking only one of the two alignment patterns while subjecting the other of the two alignment patterns to processing conditions effective to change the other pattern from the one pattern.

* * * * *

UNITED STATES PATENT AND TRADEMARK OFFICE
CERTIFICATE OF CORRECTION

PATENT NO. : 5,798,292

DATED : August 25, 1998

INVENTOR(S) : Mark E. Jost; David J. Hansen; Steven M. McDonald

It is certified that error appears in the above-identified patent and that said Letters Patent is hereby corrected as shown below:

Col. 4, l. 49:  Replace "result s" with --results--.

Col. 5, l. 22:  Remove "s" after "of".

Signed and Sealed this

Fifteenth Day of December, 1998

*Attest:*

BRUCE LEHMAN

*Attesting Officer*   Commissioner of Patents and Trademarks